US010110173B2

(12) United States Patent
Jo et al.

(10) Patent No.: US 10,110,173 B2
(45) Date of Patent: Oct. 23, 2018

(54) ENVELOPE TRACKING CURRENT BIAS CIRCUIT AND POWER AMPLIFIER APPARATUS

(71) Applicant: Samsung Electro-Mechanics Co., Ltd., Suwon-si (KR)

(72) Inventors: Byeong Hak Jo, Suwon-si (KR); Jong Ok Ha, Suwon-si (KR); Jeong Hoon Kim, Suwon-si (KR); Youn Suk Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/479,323

(22) Filed: Apr. 5, 2017

(65) Prior Publication Data

US 2018/0123528 A1 May 3, 2018

(30) Foreign Application Priority Data

Oct. 28, 2016 (KR) .................. 10-2016-0141913
Nov. 23, 2016 (KR) .................. 10-2016-0156628

(51) Int. Cl.
*H03F 1/32* (2006.01)
*H03F 1/30* (2006.01)
(Continued)

(52) U.S. Cl.
CPC ............ *H03F 1/32* (2013.01); *H03F 1/0216* (2013.01); *H03F 1/302* (2013.01); *H03F 3/19* (2013.01);
(Continued)

(58) Field of Classification Search
USPC .................. 330/285, 296–297, 136, 289
See application file for complete search history.

(56) References Cited

U.S. PATENT DOCUMENTS 7,567,123 B2 * 7/2009 Leung .................. H03F 1/0266
330/136
8,587,377 B2 11/2013 Khesbak et al.
(Continued)

FOREIGN PATENT DOCUMENTS

KR 10-2015-0131185 A 11/2015
WO WO 2014/150273 A1 9/2014

OTHER PUBLICATIONS

Korean Office Action dated May 11, 2018 in corresponding Korean Patent Application No. 10-2017-0070923 (4 pages in English and 4 pages in Korean).
(Continued)

*Primary Examiner* — Hieu Nguyen
(74) *Attorney, Agent, or Firm* — NSIP Law

(57) ABSTRACT

An envelope tracking current bias circuit of a power amplifier circuit including a power amplifier includes a first current source circuit configured to generate a first bias current based on a reference voltage, a second current source circuit configured to generate a second bias current based on an envelope voltage of an input signal, and a bias current generator configured to generate a first envelope tracking bias current based on the first bias current and the second bias current, and supply the first envelope tracking bias current to the power amplifier circuit to reduce amplitude modulation-phase modulation (AM-PM) distortion of the power amplifier circuit.

24 Claims, 15 Drawing Sheets

(51) Int. Cl.
*H03F 3/19* (2006.01)
*H03F 3/21* (2006.01)
*H03F 1/02* (2006.01)

(52) U.S. Cl.
CPC ......... *H03F 3/21* (2013.01); *H03F 2200/102* (2013.01); *H03F 2200/18* (2013.01); *H03F 2200/451* (2013.01)

(56) References Cited

U.S. PATENT DOCUMENTS

| | | | |
|---|---|---|---|
| 9,118,281 B2 * | 8/2015 | Hershberger | H03F 1/0261 |
| 9,331,653 B2 | 5/2016 | Khesbak et al. | |
| 9,503,026 B2 * | 11/2016 | Lam | H03F 1/0266 |
| 9,559,637 B2 * | 1/2017 | Yang | H03F 1/0205 |
| 2014/0184334 A1 | 7/2014 | Nobbe et al. | |
| 2016/0126901 A1 | 5/2016 | Knopik | |

OTHER PUBLICATIONS

V. Leung et al., "Analysis of Envelope Signal Injection for Improvement of RF Amplifier Intermodulation Distortion," *Proceedings of the IEEE 2004 Custom Integrated Circuits Conference (CICC 2004)*, Oct. 2004, pp. 133-136, conference held Oct. 3-6, 2004, Orlando.

V. Leung et al., "Analysis of Envelope Signal Injection for Improvement of RF Amplifier Intermodulation Distortion," *IEEE Journal of Solid-State Circuits*, vol. 40, No. 9, Sep. 2005, pp. 1888-1894.

\* cited by examiner

ENVELOPE TRACKING CURRENT BIAS CIRCUIT AND POWER AMPLIFIER APPARATUS

CROSS-REFERENCE TO RELATED APPLICATIONS

This application claims the benefit under 35 USC 119(a) of Korean Patent Application Nos. 10-2016-0141913 filed on Oct. 28, 2016, and 10-2016-0156628 filed on Nov. 23, 2016, in the Korean Intellectual Property Office, the entire disclosures of which are incorporated herein by reference for all purposes.

BACKGROUND

1. Field

This application relates to an envelope tracking current bias circuit and a power amplifier apparatus that may be applied to a communications system.

2. Description of Related Art

In general, power amplifier modules (PAMs) amplify radio frequency (RF) signals in transmitters and transmit the amplified RF signals to antennas. Because such PAMs support a wide range of frequency bands, the PAMs may include a plurality of switches, a plurality of filters, and a plurality of power amplifiers (PAs) amplifying RF signals.

The performance of PAMs may be evaluated by maximum output, efficiency, linearity, and other performance measures. PAMs are components that use a relatively large amount of current in mobile phones, and accordingly current consumption may be also one of the performance measures of PAMs.

Envelope tracking (ET) is used as one method for reducing the current consumption of PAMs. ET allows the power supply voltages of PAs to vary depending on the envelopes of RF signals. That is, when the power of RF signals is low, the magnitude of the power supply voltages of PAs is reduced to decrease the average current consumption of PAMs. Conversely, when the power of RF signals is high, the magnitude of the power supply voltages of PAs is increased to prevent the linearity of PAMs from deteriorating.

To increase efficiency by reducing current consumption, one example of a PAM in the related art appropriately processes shaped envelope signals using envelope tracking modules (ETMs) or envelope trackers (ETs), and uses the processed shaped envelope signals as the power supply voltages (VCC or VCC_PA) of PAs.

However, such PAMs in the related art have not provided a scheme for efficiently supplying a bias current to further reduce current consumption.

Other PAMs in the related art set a power supply voltage VCC to vary in response to the envelopes of RF signals, and set a bias current at a fixed value predetermined according to a preset table value.

However, since such PAMs set a bias current as a fixed value and provide a relatively high level of bias current to provide biasing without deterioration, even in a case in which the power of RF signals is high, the PAMs provide a higher level of bias current than necessary in a case in which the power of RF signals is low, causing a relatively high level of current consumption.

In a case in which PAMs in the related art supply power supply voltages based on envelopes while using a fixed bias current, the supply power supply voltages may be coupled to input signals in the opposite phase of the output signals of PAs. In this case, degradation of amplitude modulation-phase modulation (AM-PM) distortion characteristics of the PAMs may cause deterioration of adjacent channel power ratio (ACPR) performance of the PAMs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an envelope tracking current bias circuit of a power amplifier circuit including a power amplifier includes a first current source circuit configured to generate a first bias current based on a reference voltage; a second current source circuit configured to generate a second bias current based on an envelope voltage of an input signal; and a bias current generator configured to generate a first envelope tracking bias current based on the first bias current and the second bias current, and supply the first envelope tracking bias current to the power amplifier circuit to reduce amplitude modulation-phase modulation (AM-PM) distortion of the power amplifier circuit.

The first current source circuit may be further configured to adjust a value of the first bias current in response to a first control signal.

The second current source circuit may be further configured to adjust a value of the second bias current in response to a second control signal.

The bias current generator may be connected between an output node of the first current source circuit and an output node of the second current source circuit, and may be further configured to sum the first bias current and the second bias current to generate the first envelope tracking bias current.

In another general aspect, power amplifier apparatus includes an envelope tracking current bias circuit configured to generate a first envelope tracking bias current based on an envelope voltage of an input signal; and a power amplifier circuit configured to be current biased based on the first envelope tracking bias current to amplify power of the input signal; and the power amplifier circuit includes a power amplifier configured to receive the input signal at a base of the power amplifier and amplify the power of the input signal; and a buffered bias circuit configured to generate a second envelope tracking bias current based on the first envelope tracking bias current, and supply the second envelope tracking bias current to the base of the power amplifier to reduce AM-PM distortion of the power amplifier circuit.

The envelope tracking current bias circuit may include a first current source circuit configured to generate a first bias current based on a reference voltage; a second current source circuit configured to generate a second bias current based on the envelope voltage; and a bias current generator configured to generate the first envelope tracking bias current based on the first bias current and the second bias current, and supply the first envelope tracking bias current to the buffered bias circuit.

The first current source circuit may be further configured to adjust a value of the first bias current in response to a first control signal.

The second current source circuit may be further configured to adjust a value of the second bias current in response to a second control signal.

The bias current generator may be connected between an output node of the first current source circuit and an output node of the second current source circuit, and may be further configured to sum the first bias current and the second bias current to generate the first envelope tracking bias current.

The power amplifier apparatus may further include an envelope tracking circuit configured to supply the envelope voltage of the input signal as a power supply voltage to the power amplifier circuit; and the envelope tracking current bias circuit may be further configured to receive the power supply voltage as the envelope voltage from the envelope tracking circuit.

The power amplifier apparatus may further include an envelope detecting circuit configured to detect the envelope voltage of the input signal; and the envelope tracking current bias circuit may be further configured to receive the envelope voltage from the envelope detecting circuit.

The buffered bias circuit may include a current bias circuit connected between an output terminal of the envelope tracking current bias circuit and a ground; and a current amplifier configured to be current biased by the current bias circuit to amplify the first envelope tracking bias current to generate the second envelope tracking bias current.

The current bias circuit may include a first bias resistor connected between the output terminal of the envelope tracking current bias circuit and a base of the current amplifier; and a temperature compensating circuit connected between the base of the current amplifier and the ground, and having a temperature-dependent resistance value.

The temperature compensating circuit may include at least two diode-connected transistors connected in series between the base of the current amplifier and the ground.

The temperature compensating circuit may include at least two diodes connected in series between the base of the current amplifier and the ground.

The current amplifier may include a resistor connected to an output terminal of the current amplifier from which the second envelope tracking bias current is output to prevent thermal runaway.

In another general aspect, a power amplifier apparatus includes a power amplifier having a base and configured amplify an input signal applied to the base; a tracking current bias circuit configured to generate a first tracking bias current based on a fixed reference value and a time-varying parameter of the input signal; and a buffered bias circuit configured to amplify the first tracking bias current to generate a second tracking bias current, and apply the second tracking bias current to the base of the power amplifier to reduce amplitude modulation-phase modulation (AM-PM) distortion of the power amplifier.

The time-varying parameter of the input signal may be an envelope voltage of the input signal.

The tracking current bias circuit may include a first current source circuit configured to generate a first bias current based on the fixed reference value; a second current source circuit configured to generate a second bias current based on the time-varying parameter of the input signal; and a bias current generator configured to sum the first bias current and the second bias current to generate the first tracking bias current.

The tracking current bias circuit may be further configured to adjust a ratio of the first bias current to the second bias current in the first tracking bias current.

In another general aspect, a power amplifier apparatus includes a power amplifier circuit configured to amplify an input signal and having a characteristic that produces amplitude modulation-phase modulation (AM-PM) distortion that varies in response to a voltage level of the input signal; and an envelope tracking current bias circuit configured to generate a first tracking bias current based on a fixed reference voltage and an envelope voltage of the input signal, and apply the first tracking bias current to the power amplifier circuit to reduce the AM-PM distortion of the power amplifier circuit.

The power amplifier circuit may include a power amplifier having a base to which the input signal is applied, and configured to amplify the input signal applied to the base; and a buffered bias circuit configured to amplify the first tracking bias current to generate a second tracking bias current, and apply the second tracking bias current to the base of the power amplifier to reduce the amplitude modulation-phase modulation (AM-PM) distortion of the power amplifier circuit.

The power amplifier may include a bipolar junction transistor (BJT) having the base, a collector, an emitter, a base-emitter direct current (DC) voltage (VBE) that varies in response to the voltage level of the input signal, and a collector-base capacitance (Ccb) that varies in response to the VBE, thereby producing the AM-PM distortion.

The power amplifier apparatus may further include an envelope tracking circuit configured to generate a power supply voltage (VCC) based on the envelope voltage of the input signal, and apply the VCC to the collector of the BJT; the collector of the BJT may be configured to output the amplified input signal; and the emitter of the BJT may be connected to a ground.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Figure 1:
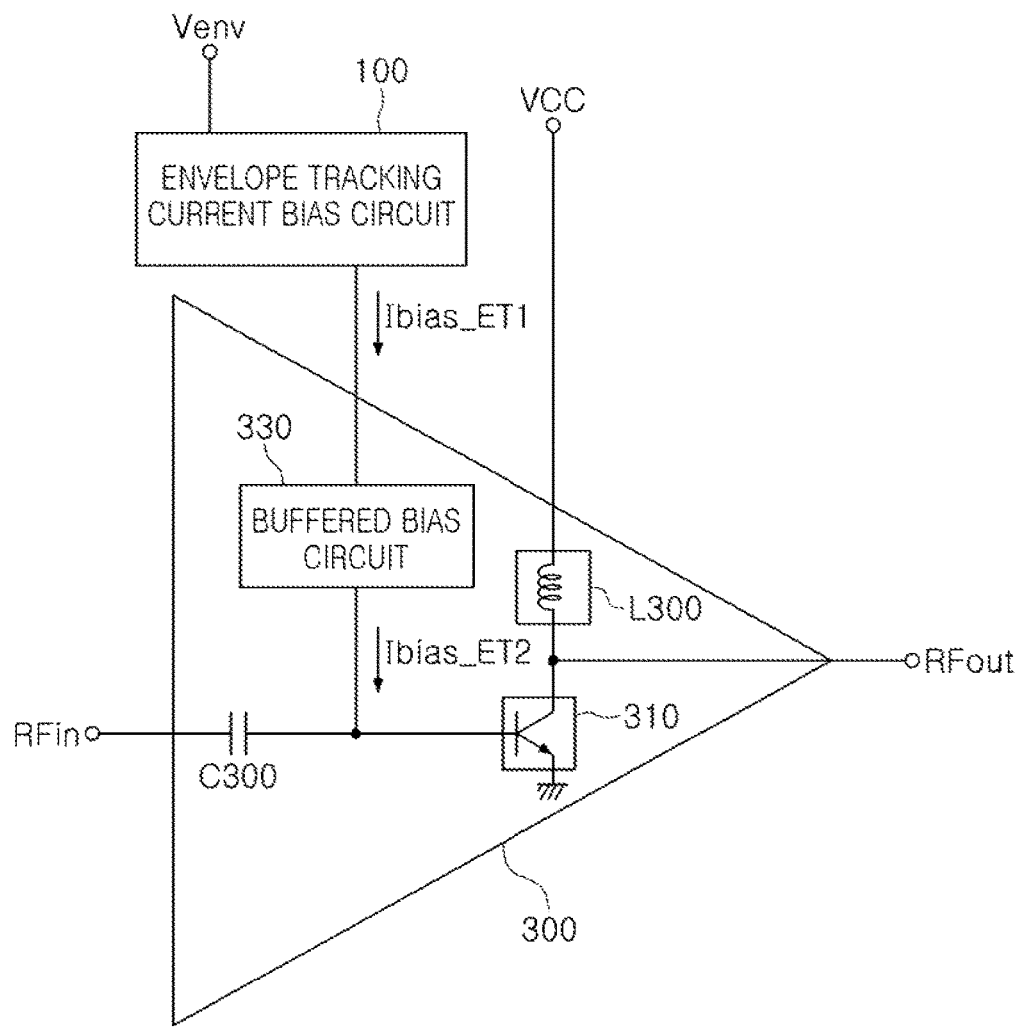
FIG. 1 is a block diagram of an example of a power amplifier apparatus.
Figure 2:
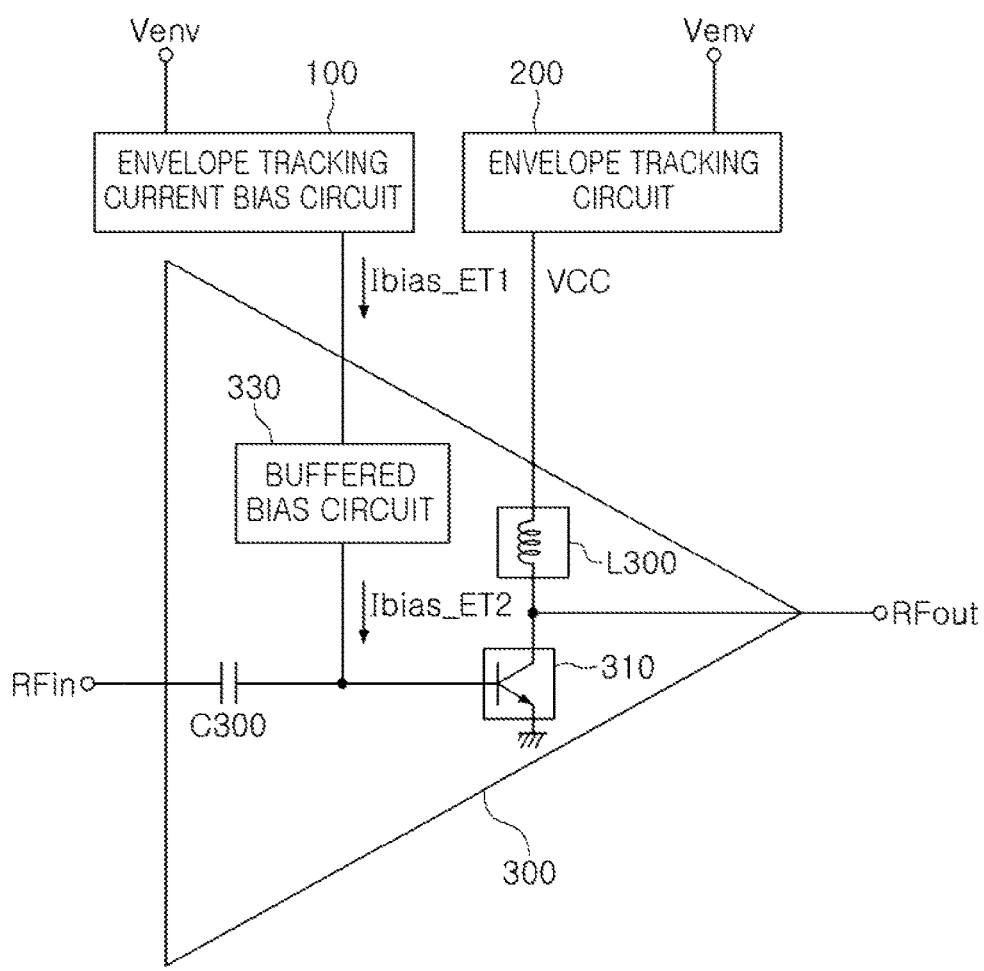
FIG. 2 is a block diagram of another example of a power amplifier apparatus.

FIG. 1 is a block diagram of an example of a power amplifier apparatus. FIG. 2 is a block diagram of another example of a power amplifier apparatus.

Referring to FIGS. 1 and 2, the power amplifier apparatus includes an envelope tracking (ET) current bias circuit 100 and a power amplifier circuit 300.

Referring to FIG. 2, the power amplifier apparatus further includes an ET circuit 200 supplying a power supply voltage VCC to the power amplifier circuit 300 based on an envelope voltage Venv of an input signal RFin. The envelope voltage Venv of the input signal RFin varies with time, and thus is a time-varying parameter of the input signal RFin.

The ET current bias circuit 100 generates a first ET bias current Ibias_ET1 based on the envelope voltage Venv of the input signal RFin.

The power amplifier circuit 300 is current biased by the first ET bias current Ibias_ET1 to amplify power of the input signal RFin.

The power amplifier circuit 300 includes a power amplifier 310 and a buffered bias circuit 330.

The power amplifier 310 amplifies the power of the input signal RFin received through an input terminal of the power amplifier circuit 300 to produce an amplified output signal RFout at an output terminal of the power amplifier circuit 300.

The buffered bias circuit 330 generates a second ET bias current Ibias_ET2 based on the first ET bias current Ibias_ET1, and supplies the generated second ET bias current Ibias_ET2 to a base of the power amplifier 310.

In one example, when the buffered bias circuit 330 has a current gain of at least 100, the buffered bias circuit 330 amplifies the first ET bias current Ibias_ET1 having a microampere (µA) level to the second ET bias current Ibias_ET2 having a milliampere (mA) level.

Also, the ET current bias circuit 100 reduces amplitude modulation-phase modulation (AM-PM) distortion of the power amplifier circuit 300 by supplying the first ET bias current Ibias_ET1 to the power amplifier circuit 300.

As illustrated in FIGS. 1 and 2, C300 is a capacitor for blocking a direct current (DC) voltage in the input signal RFin, and L300 is an inductor for blocking power supply voltage noise in the power supply voltage VCC.

In describing the drawings, repeated descriptions of elements denoted by the same reference numerals and having the same functions will be omitted, while features that are different from drawing to drawing will be described.

Figure 3:
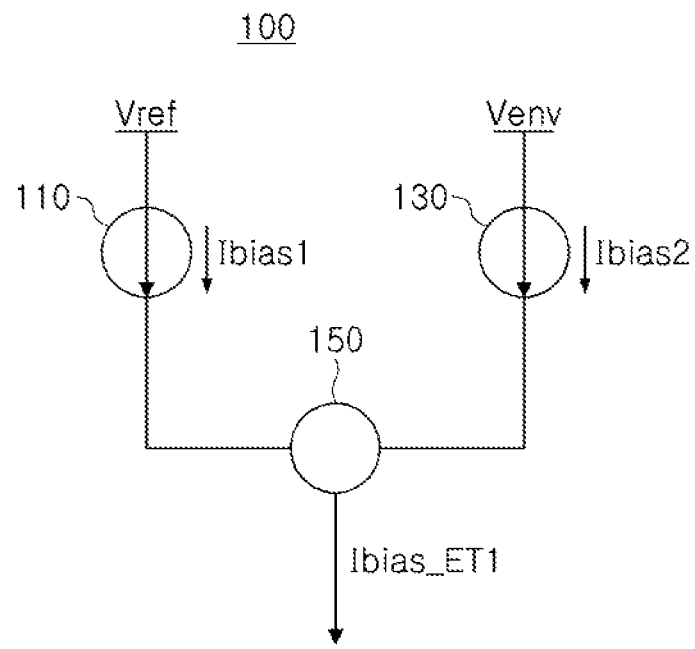
FIG. 3 is a circuit diagram of an example of an envelope tracking (ET) current bias circuit in FIGS. 1 and 2.

FIG. 3 is a circuit diagram of an example of the ET current bias circuit 100 in FIGS. 1 and 2.

Referring to FIG. 3, the ET current bias circuit 100 includes a first current source circuit 110, a second current source circuit 130, and a bias current generator 150.

The first current source circuit 110 generates a first bias current Ibias1 based on a reference voltage Vref. Because the first bias current Ibias1 is generated based on the reference voltage Vref, the first bias current Ibias1 is constant.

The second current source circuit 130 generates a second bias current Ibias2 based on an envelope voltage Venv of an input signal. Because the second bias current Ibias2 is generated based on the envelope voltage Venv, the second bias current Ibias2 varies depending on an envelope of the input signal.

The bias current generator 150 generates a first ET bias current Ibias_ET1 based on the first and second bias currents Ibias1 and Ibias2, and supplies the generated first ET bias current Ibias_ET1 to the power amplifier circuit 300.

In one example, the bias current generator 150 reduces AM-PM distortion of the power amplifier circuit 300 by supplying the first ET bias current Ibias_ET1 to the power amplifier circuit 300.

The first and second current source circuits 110 and 130 in FIG. 3 will be described with reference to FIGS. 5 and 6.

In one example, the bias current generator 150 connects an output node of the first current source circuit 110 to an output node of the second current source circuit 130, and sums the first and second bias currents Ibias1 and Ibias2, thus generating the first ET bias current Ibias_ET1.

Figure 4:
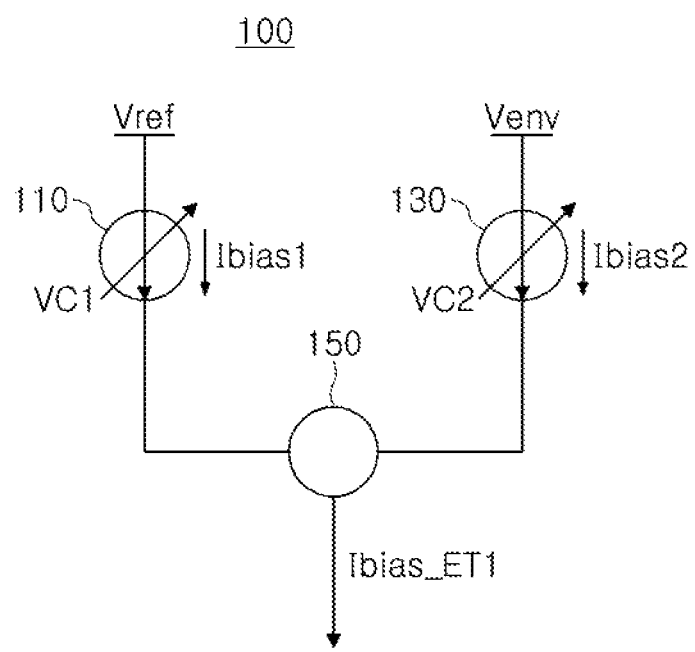
FIG. 4 is a circuit diagram of another example of the ET current bias circuit in FIGS. 1 and 2.

FIG. 4 is a circuit diagram of another example of the ET current bias 100 circuit in FIGS. 1 and 2.

Referring to FIG. 4, the first current source circuit 110 adjusts a value of the first bias current Ibias1 generated based on the reference voltage Vref in response to a first control signal VC1.

The second current source circuit 130 adjusts a value of the second bias current Ibias2 generated based on the envelope voltage Venv in response to a second control signal VC2.

Accordingly, as illustrated in FIGS. 21A to 21I to be described below, the first ET bias current Ibias_ET1 generated by the bias current generator 150 has an adjustable ratio of the value of the first bias current Ibias1 adjusted in response to the first control signal VC1 to the second bias current Ibias2 adjusted in response to the second control signal VC2.

The first and second current source circuits 110 and 130 in FIG. 4 will be described with reference to FIGS. 7 and 8.

Figure 5:
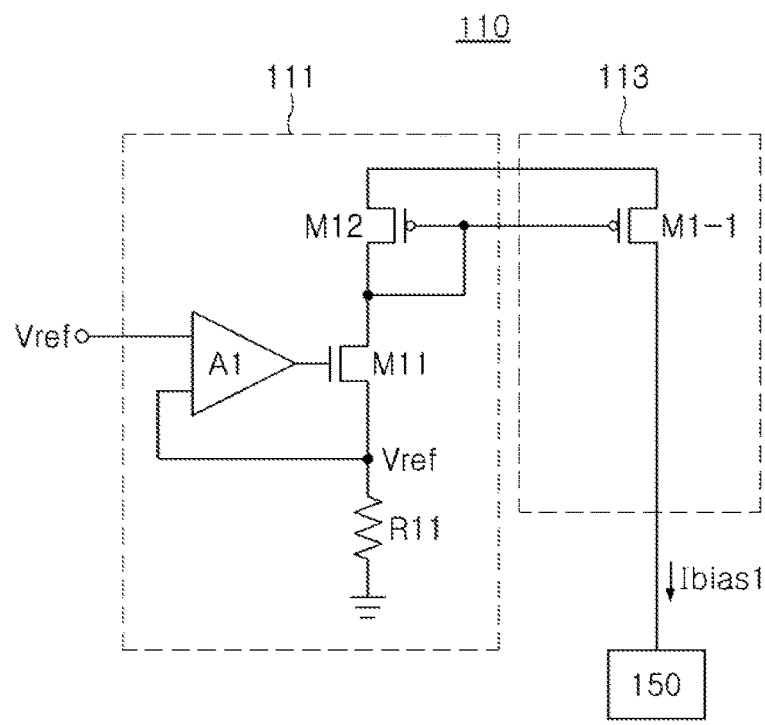
FIG. 5 is a circuit diagram of an example of a first current source circuit in FIG. 3.

FIG. 5 is a circuit diagram of an example of the first current source circuit 110 in FIG. 3.

Referring to FIG. 5, the first current source circuit 110 includes a first current source 111 and a first current mirror circuit 113.

The first current source 111 includes a first operational amplifier A1, a first resistor R11, a first metal-oxide-semiconductor (MOS) transistor M11, and a second MOS transistor M12.

The first operational amplifier A1 includes a first input terminal receiving the reference voltage Vref, a second input terminal connected to one end of the first resistor R11, and an output terminal connected to a gate of the first MOS transistor M11.

The first MOS transistor M11 regulates an internal current according to an output voltage of the first operational amplifier A1, and the second MOS transistor M12 is stacked on the first MOS transistor M11.

The reference voltage Vref is applied to one end of the first resistor R11 by the first operational amplifier A1, and the other end of the first resistor R11 is connected to ground. Accordingly, the internal current is generated according to the reference voltage Vref and a resistance value of the first resistor R11, and is allowed to flow through the second MOS transistor M12 and the first MOS transistor M11.

The first current mirror circuit 113 includes a MOS transistor M1-1 having a gate connected to a gate of the second MOS transistor M12, and performing current mirroring.

The MOS transistor M1-1 provides a current generated by mirroring the internal current according to a ratio of the size of the MOS transistor M1-1 to the size of the second MOS transistor M12. The generated current is provided to the bias current generator 150 as the first bias current Ibias1.

Figure 6:
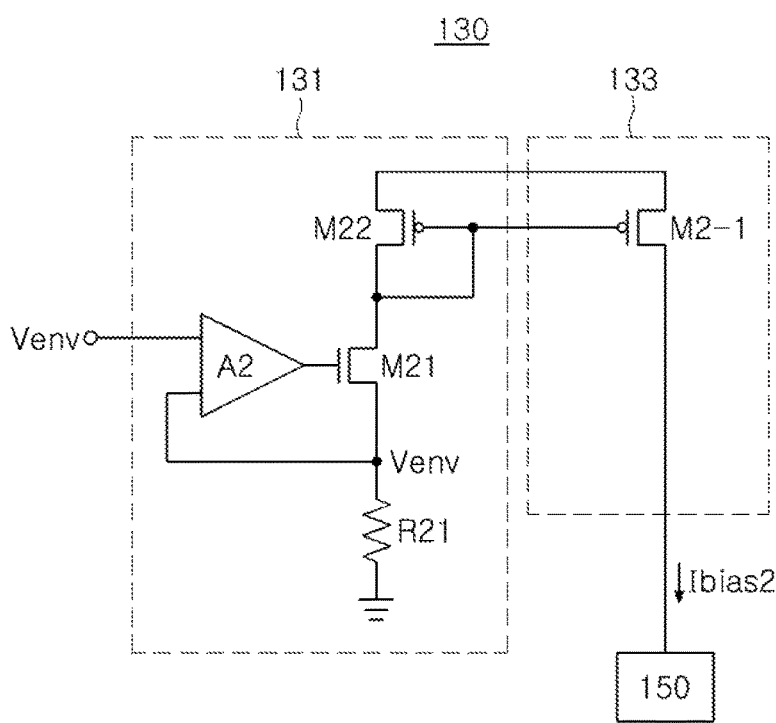
FIG. 6 is a circuit diagram of an example of a second current source circuit in FIG. 3.

FIG. 6 is a circuit diagram of an example of the second current source circuit 130 in FIG. 3.

Referring to FIG. 6, the second current source circuit 130 includes a second current source 131 and a second current mirror circuit 133.

The second current source 131 includes a second operational amplifier A2, a second resistor R21, a third MOS transistor M21, and a fourth MOS transistor M22.

The second operational amplifier A2 includes a first input terminal receiving the envelope voltage Venv, a second input terminal connected to one end of the second resistor R21, and an output terminal connected to a gate of the third MOS transistor M21.

The third MOS transistor M21 regulates an internal current according to an output voltage of the second operational amplifier A2, and the fourth MOS transistor M22 is stacked on the third MOS transistor M21.

The envelope voltage Venv is applied to one end of the second resistor R21 by the second operational amplifier A2, and the other end of the second resistor R21 is connected to ground. Accordingly, the internal current is generated according to the envelope voltage Venv and a resistance value of the second resistor R21, and is allowed to flow through the fourth MOS transistor M22 and the third MOS transistor M21.

The second current mirror circuit 133 includes a MOS transistor M2-1 having a gate connected to a gate of the fourth MOS transistor M22, and performing current mirroring.

The MOS transistor M2-1 provides a current generated by mirroring the internal current according to a ratio of the size of the MOS transistor M2-1 to the size of the fourth MOS transistor M22. The generated current is provided to the bias current generator 150 as the second bias current Ibias2.

Figure 7:
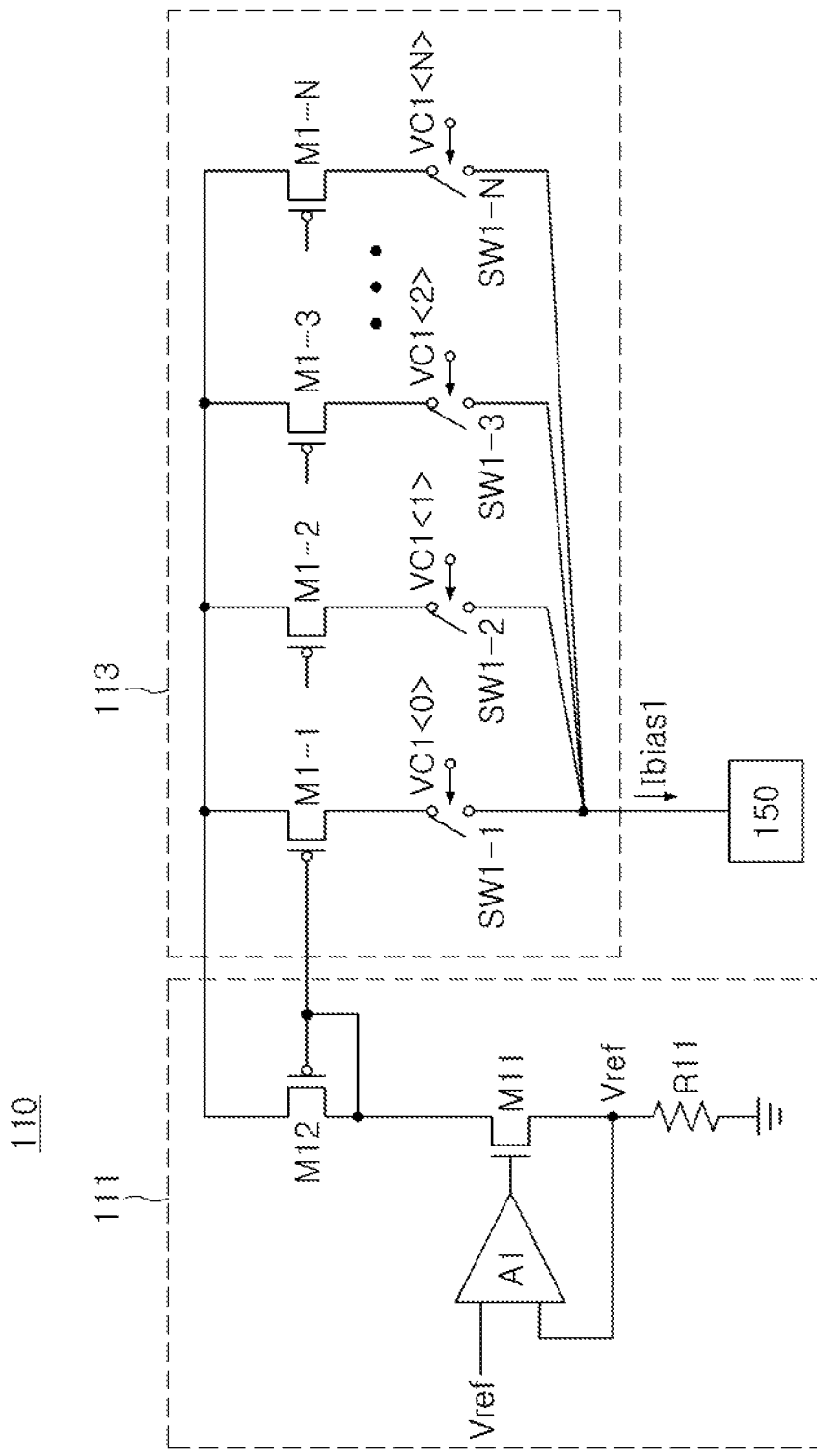
FIG. 7 is a circuit diagram of an example of a first current source circuit in FIG. 4.

FIG. 7 is a circuit diagram of an example of the first current source circuit 110 in FIG. 4.

Referring to FIG. 7, the first current source circuit 110 includes a first current source 111 and a first current mirror circuit 113.

The first current source 111 includes a first operational amplifier A1, a first resistor R11, a first MOS transistor M11, and a second MOS transistor M12.

The first operational amplifier A1 includes a first input terminal receiving the reference voltage Vref, a second input terminal connected to one end of the first resistor R11, and an output terminal connected to a gate of the first MOS transistor M11.

The first MOS transistor M11 regulates an internal current according to an output voltage of the first operational amplifier A1, and the second MOS transistor M12 is stacked on the first MOS transistor M11.

The reference voltage Vref is applied to one end of the first resistor R11 by the first operational amplifier A1, and the other end of the first resistor R11 is connected to ground. Accordingly, the internal current is generated according to the reference voltage Vref and a resistance value of the first resistor R11, and is allowed to flow through the second MOS transistor M12 and the first MOS transistor M11.

The first current mirror circuit 113 includes a plurality of MOS transistors M1-1, M1-2, M1-3, . . . M1-N having gates connected to a gate of the second MOS transistor M12, and performing current mirroring, and a plurality of switches SW1-1, SW1-2, SW1-3, . . . SW1-N respectively connected between the MOS transistors M1-1 to M1-N and an output terminal of the first current mirror circuit 113.

Each of the MOS transistors M1-1 to M1-N provides a current generated by mirroring the internal current according to a ratio of the size of the second MOS transistor M12 to the size of a respective one of the MOS transistors M1-1 to M1-N.

The switches SW1-1 to SW1-N are turned on or off in response to respective first control signals VC1<0>, VC1<1>, VC1<2>, . . . VC1<N>, and when the switches SW1-1 to SW1-N are turned on, currents mirrored by respective ones of the MOS transistors M1-1 to M1-N are selected. Then, the selected mirrored currents are summed to generate a first bias current Ibias1, which is provided to the bias current generator 150.

Accordingly, a value of the first bias current Ibias1 is determined according to the number of MOS transistors M1-1 to M1-N that have been turned on in response to the first control signals VC1<0> to VC1<N>.

Although FIG. 7 shows four or more MOS transistors M1-1 to M1-N, four or more switches SW1-1 to SW1-N, and four or more first control signals VC1<0> to VC1<N>, this is merely an example, and there may be two or three MOS transistors M1-1 to M1-N, two or three switches SW1-1 to SW1-N, and two or three first control signals VC1<0> to VC1<N>.

Figure 8:
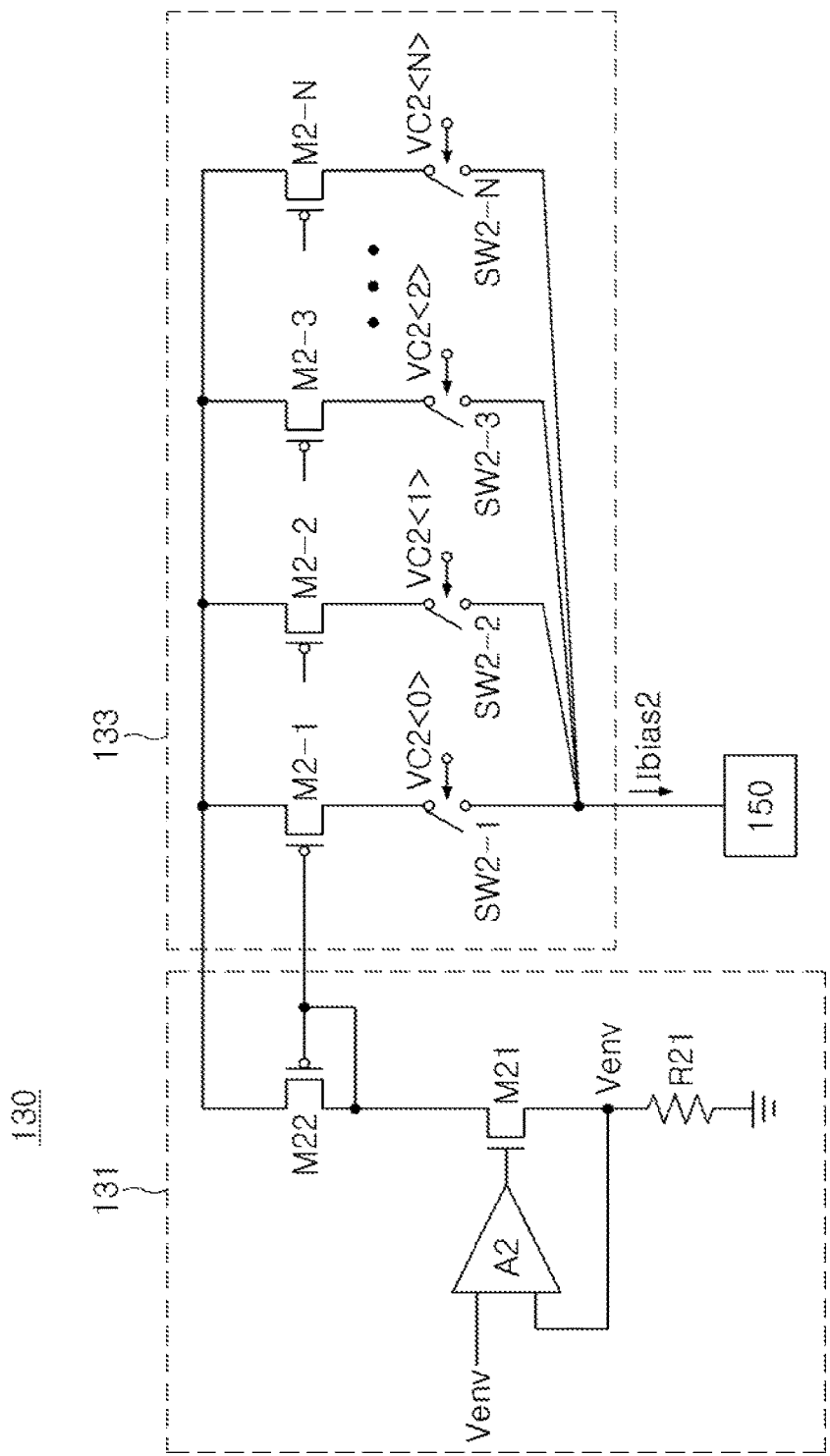
FIG. 8 is a circuit diagram of an example of a second current source circuit in FIG. 4.

FIG. 8 is a circuit diagram of an example of the second current source circuit 130 in FIG. 4.

Referring to FIG. 8, the second current source circuit 130 includes a second current source 131 and a second current mirror circuit 133.

The second current source 131 includes a second operational amplifier A2, a second resistor R21, a third MOS transistor M21, and a fourth MOS transistor M22.

The second operational amplifier A2 includes a first input terminal receiving the envelope voltage Venv, a second input terminal connected to one end of the second resistor R21, and an output terminal connected to a gate of the third MOS transistor M21.

The third MOS transistor M21 regulates an internal current according to an output voltage of the second operational amplifier A2, and the fourth MOS transistor M22 is stacked on the third MOS transistor M21.

The envelope voltage Venv is applied to one end of the second resistor R21 by the second operational amplifier A2, and the other end of the second resistor R21 is connected to ground. Accordingly, the internal current is generated according to the envelope voltage Venv and a resistance value of the second resistor R21, and is allowed to flow through the fourth MOS transistor M22 and the third MOS transistor M21.

The second current mirror circuit 133 includes a plurality of MOS transistors M2-1, M2-2, M2-3, . . . M2-N having gates connected to a gate of the fourth MOS transistor M22, and performing current mirroring, and a plurality of switches SW2-1, SW2-2, SW2-3, . . . SW2-N respectively connected between the MOS transistors M2-1, M2-2, M2-3, . . . M2-N and an output terminal of the second current mirror circuit 133.

Each of the MOS transistors M2-1 to M2-N provides a current generated by mirroring the internal current according to a ratio of the size of the fourth MOS transistor M22 to the size of a respective one of the MOS transistors M2-1 to M2-N.

The switches SW2-1 to SW2-N are turned on or off in response to respective second control signals VC2<0>, VC2<1>, VC2<2>, . . . VC2<N>, and when the switches SW2-1 to SW2-N are turned on, currents mirrored by respective ones of the MOS transistors M2-1 to M2-N are selected. Then, the selected mirrored currents are summed to generate a second bias current Ibias2, which is provided to the bias current generator 150.

Accordingly, a value of the second bias current Ibias2 is determined according to the number of MOS transistors M2-1 to M2-N that have been turned on in response to the second control signals VC2<0> to VC2<N>.

Although FIG. 8 shows four or more MOS transistors M2-1 to M2-N, four or more switches SW2-1 to SW2-N, and four or more second control signals VC2<0> to VC2<N>, this is merely an example, and there may be two or three MOS transistors M2-1 to M2-N, two or three switches SW2-1 to SW2-N, and two or three second control signals VC2<0> to VC2<N>.

Figure 9:
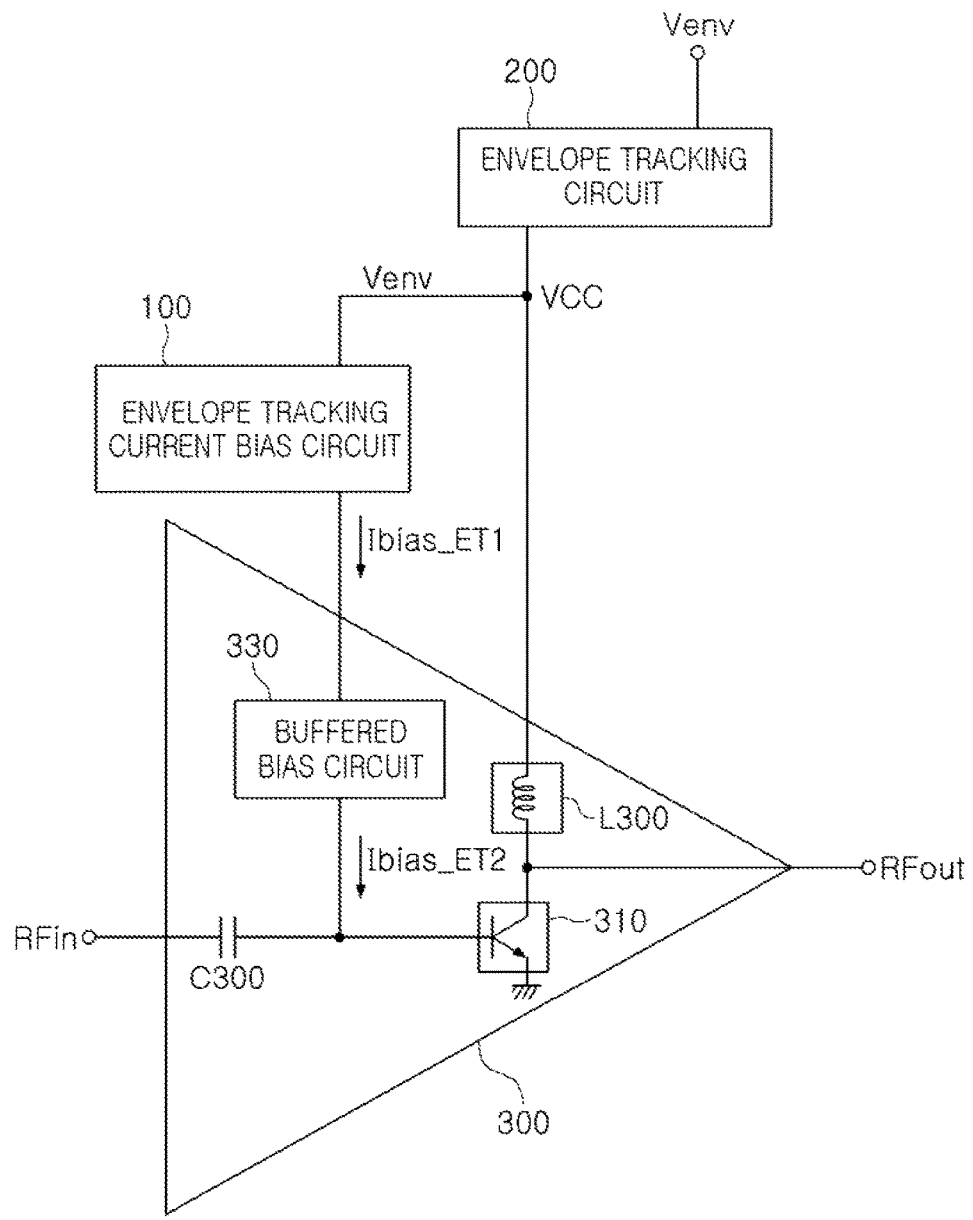
FIG. 9 is a block diagram of another example of a power amplifier apparatus.

FIG. 9 is a block diagram of another example of a power amplifier apparatus.

Referring to FIG. 9, the power amplifier apparatus includes an ET circuit 200 in addition to the structure of FIG. 1, and the ET circuit 200 supplies an envelope voltage Venv of the input signal RFin as a power supply voltage VCC to the power amplifier circuit 300.

In one example, the ET current bias circuit 100 receives the power supply voltage VCC as the envelope voltage Venv from the ET circuit 200.

Figure 10:
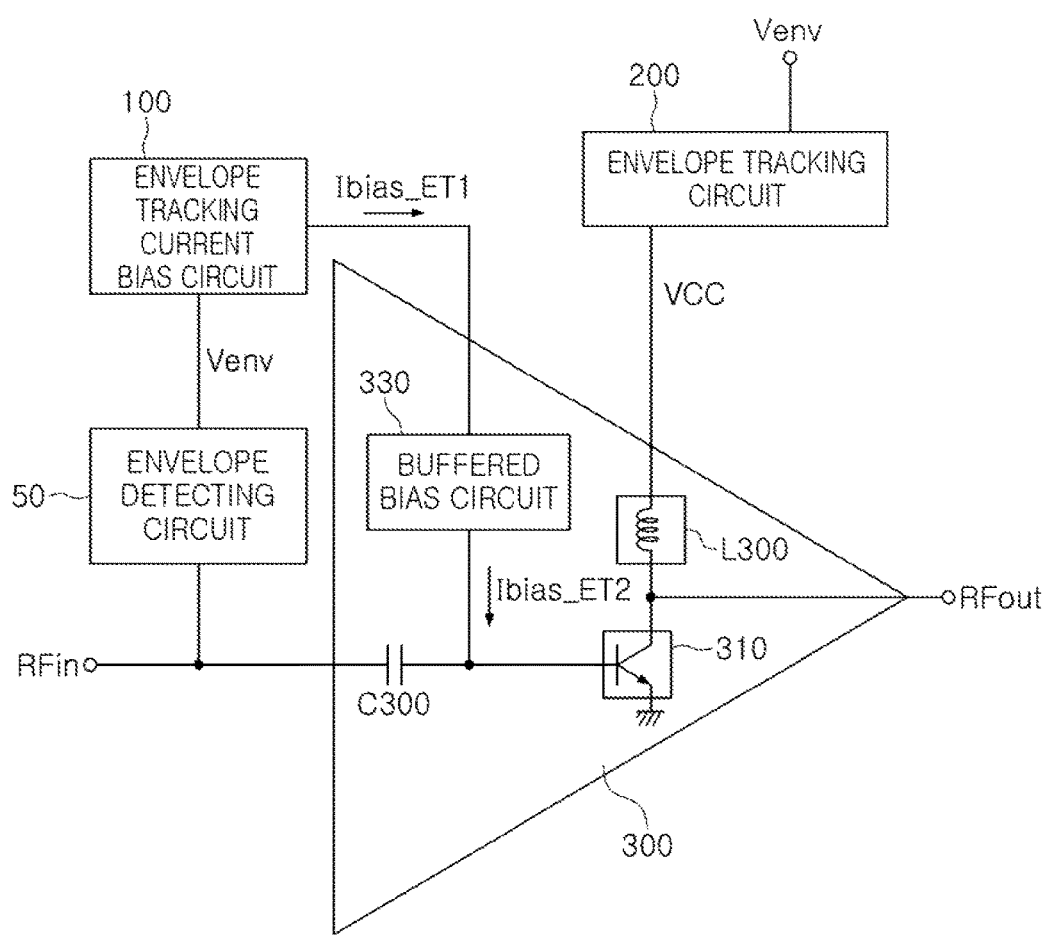
FIG. 10 is a block diagram of another example of a power amplifier apparatus.

FIG. 10 is a block diagram of another example of a power amplifier apparatus.

Referring to FIG. 10, the power amplifier apparatus includes an envelope detecting circuit 50 in addition to the structure of FIG. 2. The envelope detecting circuit 50 detects an envelope voltage Venv of the input signal RFin, and supplies the envelope voltage Venv to the ET current bias circuit 100 and the ET circuit 200.

Accordingly, the ET current bias circuit 100 and the ET circuit 200 receive the envelope voltage Venv from the envelope detecting circuit 50.

Figure 11:
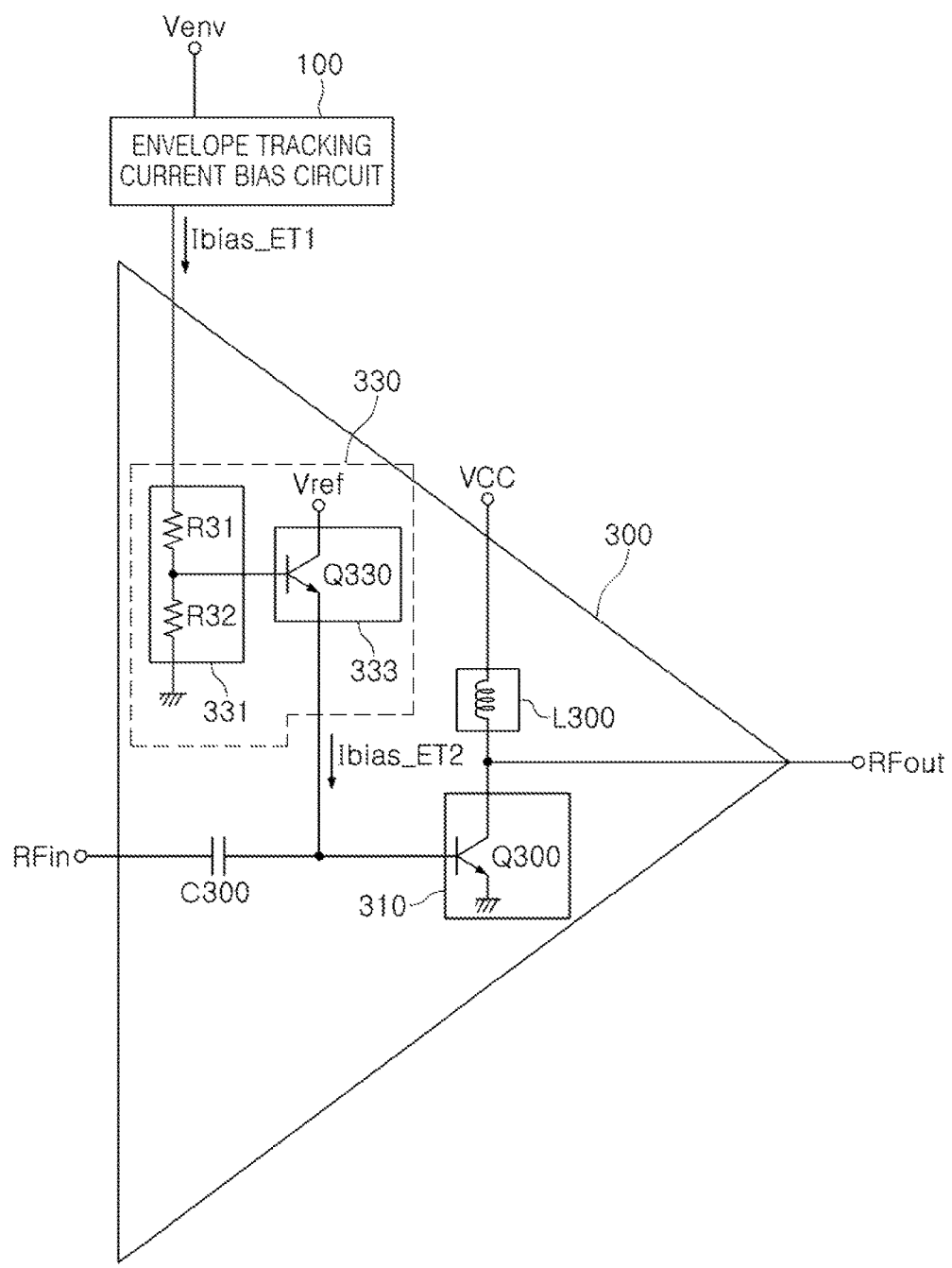
FIG. 11 is a circuit diagram of an example of the power amplifier apparatus in FIG. 1.

FIG. 11 is a circuit diagram of an example of the power amplifier apparatus in FIG. 1.

Referring to FIG. 11, the buffered bias circuit 330 includes a current bias circuit 331 and a current amplifier 333.

The current bias circuit 331 is connected between the output terminal of the ET current bias circuit 100 and ground. In one example, the current bias circuit 331 includes a voltage dividing bias circuit including two resistors R31 and R32 in series between the output terminal of the ET current bias circuit 100 and ground.

The current amplifier 333 is current biased by the current bias circuit 331 to amplify the first ET bias current Ibias_ET1 to generate the second ET bias current Ibias_ET2. In one example, the current amplifier 333 includes a bipolar junction transistor (BJT) Q330 having a collector supplied with the reference voltage Vref, an emitter connected to the base of the power amplifier 310, and a base connected to a node between the resistors R31 and R32 of the current bias circuit 331.

Also, the power amplifier 310 included in the power amplifier circuit 300 includes a BJT Q300 having a base receiving the second ET bias current Ibias_ET2.

A collector of the BJT Q300 receives a power supply voltage VCC through the coil L300, and receives the input signal RFin through the DC blocking capacitor C300 connected to the input terminal of the power amplifier circuit 300.

Figure 12:
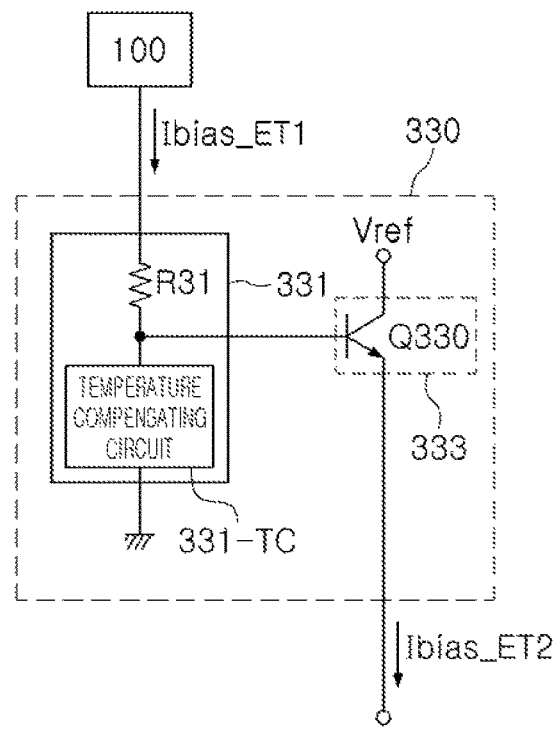
FIG. 12 is a circuit diagram of an example of a buffered bias circuit.

FIG. 12 is a circuit diagram of an example of the buffered bias circuit 330.

Referring to FIG. 12, the current bias circuit 331 includes a first bias resistor R31 and a temperature compensating circuit 331_TC.

The first bias resistor R31 is connected between the output terminal of the ET current bias circuit 100 and the base of the current amplifier 333.

The temperature compensating circuit 331_TC is connected between the base of the current amplifier 333 and ground, and has a resistance value that varies depending on temperature to perform temperature compensation.

A voltage applied to the temperature compensating circuit 331_TC is determined according to a resistance value of the first bias resistor R31 and a resistance value of the temperature compensating circuit 331_TC, and a bias current is determined depending on the determined voltage.

Figure 13:
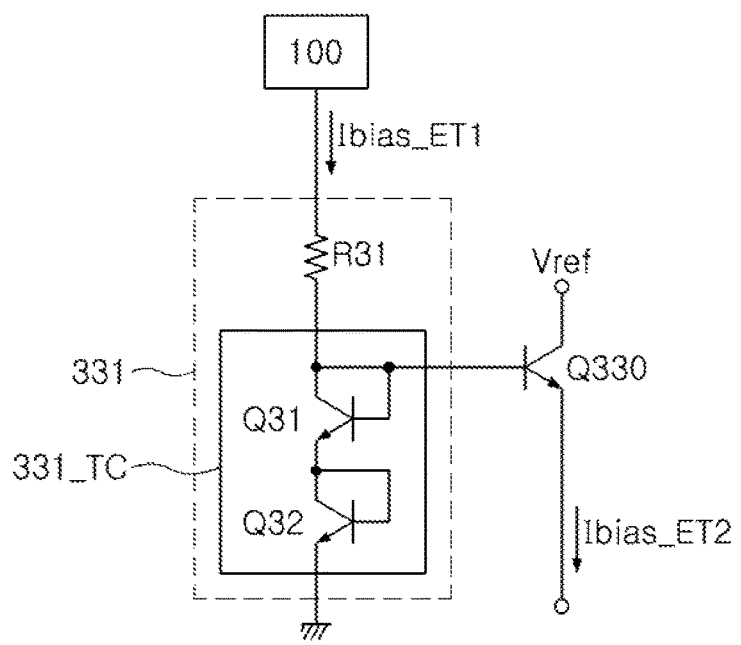
FIG. 13 is a circuit diagram of another example of a buffered bias circuit.

FIG. 13 is a circuit diagram of another example of the buffered bias circuit 330.

Referring to FIG. 13, the temperature compensating circuit 331_TC includes at least two diode-connected transistors Q31 and Q32 connected in series between the base of the current amplifier 333 and ground. The at least two diode-connected transistors Q31 and Q32 have resistance values that vary depending on temperature to perform temperature compensation.

Figure 14:
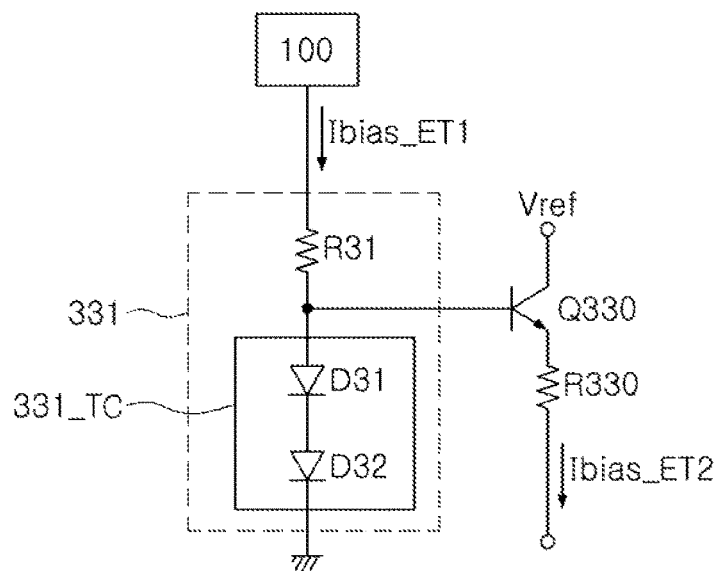
FIG. 14 is a circuit diagram of another example of a buffered bias circuit.

FIG. 14 is a circuit diagram of another example of the buffered bias circuit 330.

Referring to FIG. 14, the temperature compensating circuit 331_TC includes at least two diodes D31 and D32 connected in series between the base of the current amplifier 333 and the ground. The at least two diodes D31 and D32 have resistance values that vary depending on temperature to perform temperature compensation.

The current amplifier 333 includes a resistor R330 at an output terminal thereof outputting the second ET bias current Ibias_ET2 to prevent thermal runaway.

Figure 15:
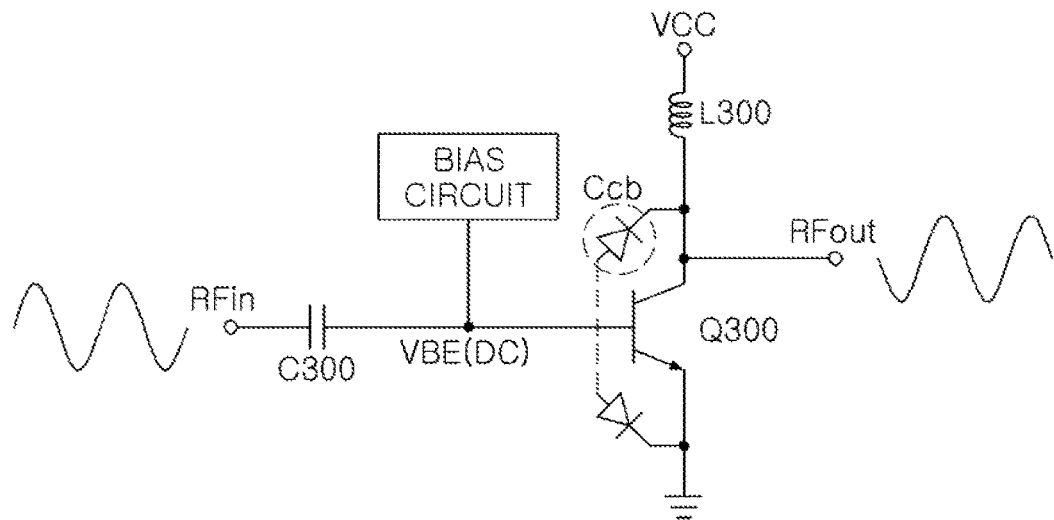
FIG. 15 is a diagram illustrating an example of a concept of an amplitude modulation-phase modulation (AM-PM) distortion of a power amplifier apparatus.

FIG. 15 is a diagram illustrating an example of a concept of an AM-PM distortion of a power amplifier apparatus.

Referring to FIG. 15, a base-emitter DC voltage VBE (DC) of the power amplifier circuit included in the power amplifier apparatus varies in accordance with a voltage level of the input signal RFin, thereby causing a collector-base capacitance (Ccb) due to a diode between a collector and a base of the power amplifier to vary, and AM-PM distortion to eventually occur.

When a bias current supplied to the base of the power amplifier circuit has a fixed value, the above-mentioned AM-PM distortion may occur. However, when an ET bias current of this application is supplied to the base of the power amplifier circuit to prevent the base-emitter DC voltage VBE (DC) of the power amplifier circuit from decreasing when the power of the input signal RFin is high, and prevent the base-emitter DC voltage VBE (DC) of the power amplifier circuit from increasing when the power of the input signal RFin is low, a variation of the base-emitter DC voltage VBE (DC) of the power amplifier is reduced despite changes in the input signal RFin and the power supply voltage VCC. As a result, the AM-PM distortion is reduced and ACPR performance is improved.

Figure 16A:
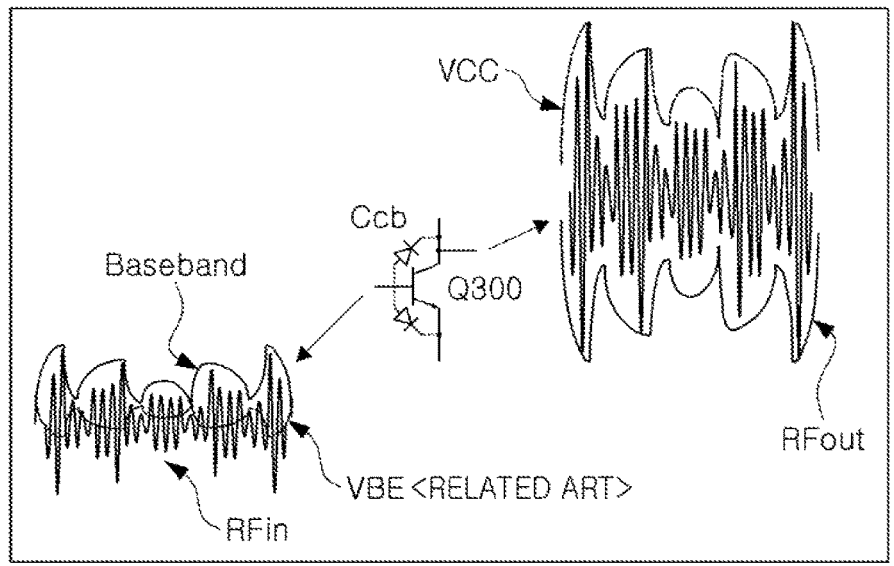
FIGS. 16A and 16B are diagrams illustrating an example of an improvement in an AM-PM distortion of a power amplifier apparatus.
Figure 16B:
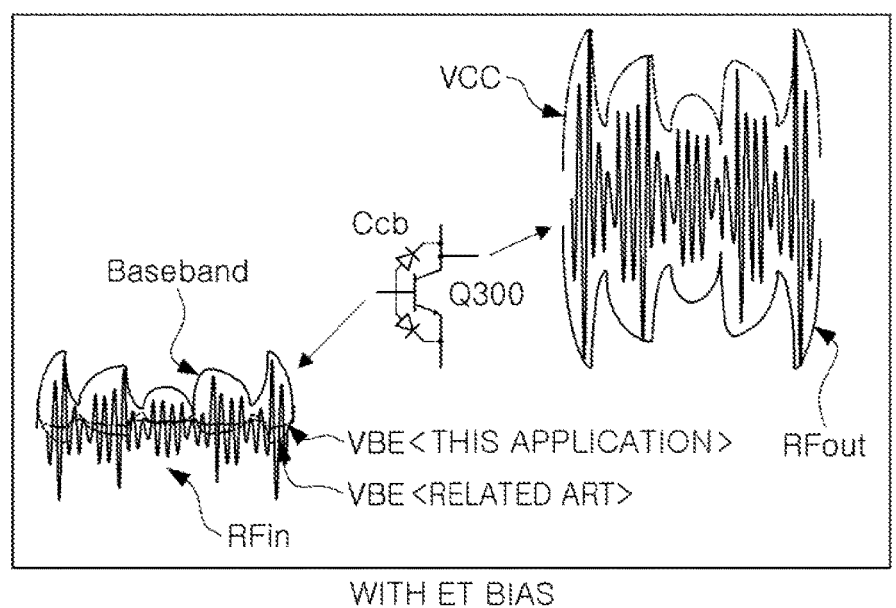

FIGS. 16A and 16B are diagrams illustrating an example of an improvement in an AM-PM distortion of a power amplifier apparatus.

As illustrated in FIG. 16A, with reference to a signal input to the BJT Q300 of the power amplifier circuit 300 without an ET bias current as in the related art, when a power of an input signal is high, a base-emitter DC voltage VBE (DC) decreases. Accordingly, a collector-base capacitance Ccb of the BJT Q300 increases, and an AM-PM distortion increases.

As illustrated in FIG. 16B, with reference to a signal input to the BJT Q300 of the power amplifier circuit 300 with an ET bias current as described in this application, a base-emitter DC voltage VBE (DC) of the related art, and a base-emitter DC voltage VBE (DC) of the present disclosure, when the power of the input signal is high, an ET bias current is applied to prevent the base-emitter DC voltage VBE (DC) of the BJT Q300 from decreasing. Accordingly, the collector-base capacitance Ccb of the BJT Q300 decreases, and the AM-PM distortion decreases.

Figure 17:
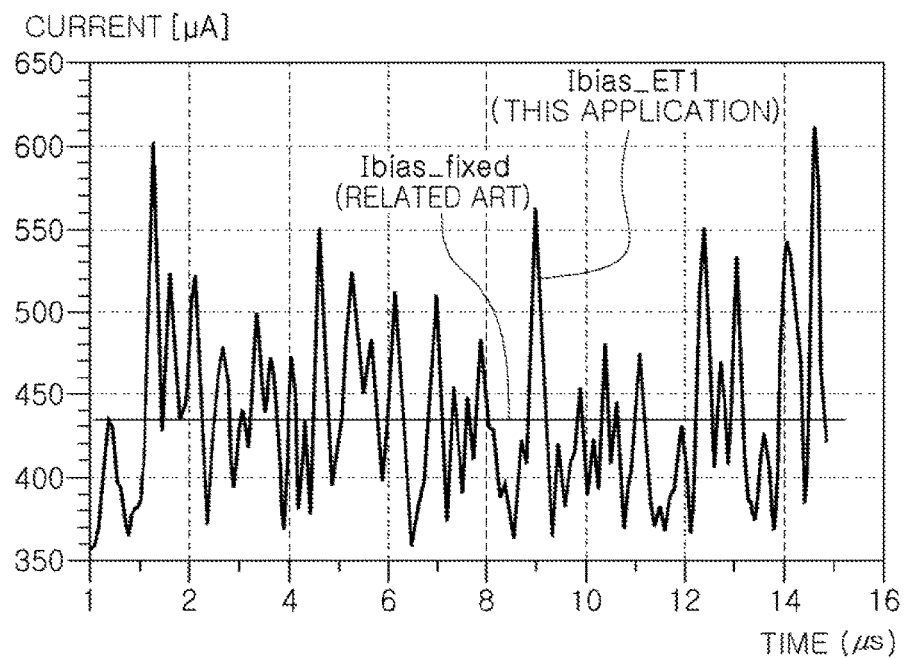
FIG. 17 is a graph illustrating an example of a fixed bias current of the related art and an example of a first ET bias current of this application over time in µs.

FIG. 17 is a graph illustrating an example of a fixed bias current Ibias_fixed of the related art and an example of a first ET bias current Ibias_ET1 of this application over time in μs.

Figure 18:
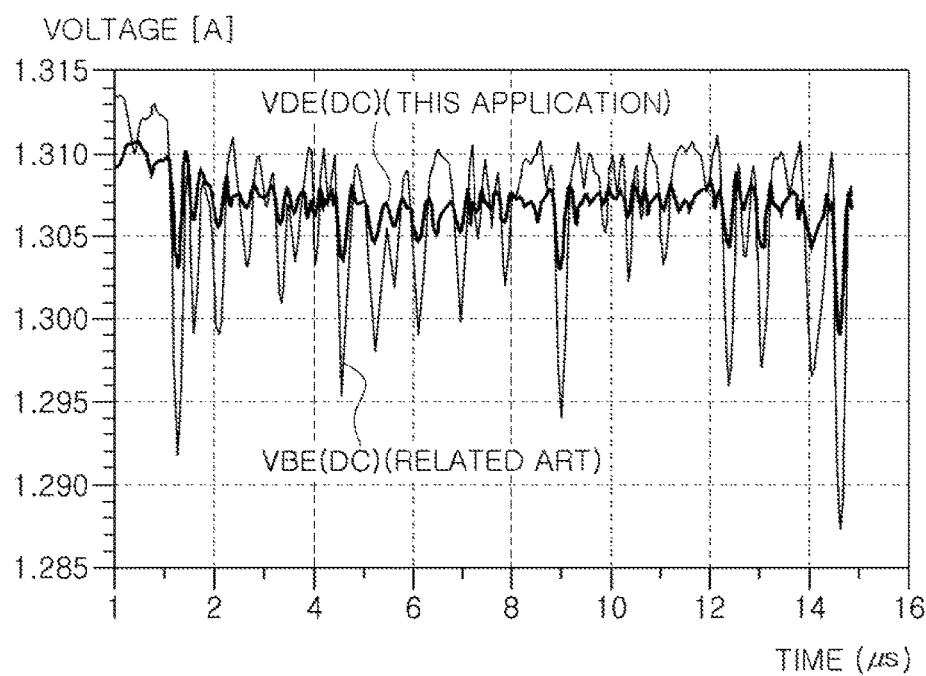
FIG. 18 is a graph illustrating an example of a base-emitter direct current (DC) voltage produced by the fixed bias current of the related art and an example of a base-emitter DC voltage produced by the first ET bias current of this application over time in µs.

FIG. 18 is a graph illustrating an example of a base-emitter DC voltage VBE (DC) produced by the fixed bias current Ibias_fixed of the related art and an example of a base-emitter DC voltage VBE (DC) produced by the first ET bias current Ibias_ET1 of this application over time in μs.

Referring to FIG. 18, a variation of the base-emitter DC voltage VBE (DC) of produced by the first ET bias current Ibias_ET1 of this application is reduced compared to a variation of the base-emitter DC voltage VBE (DC) produced by the fixed bias current Ibias_fixed of the related art.

Figure 19:
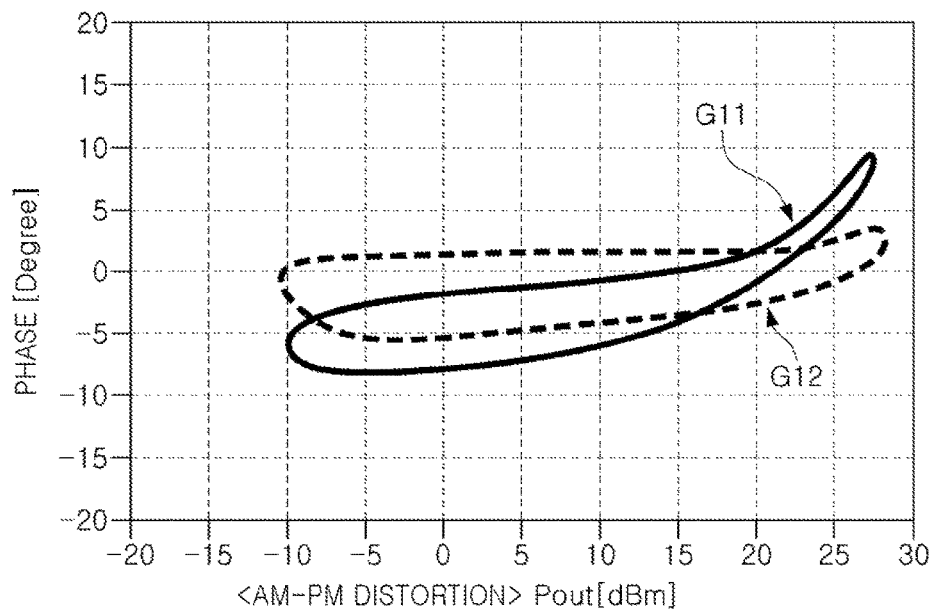
FIG. 19 is a graph illustrating an example of AM-PM distortion simulation results.
Figure 20:
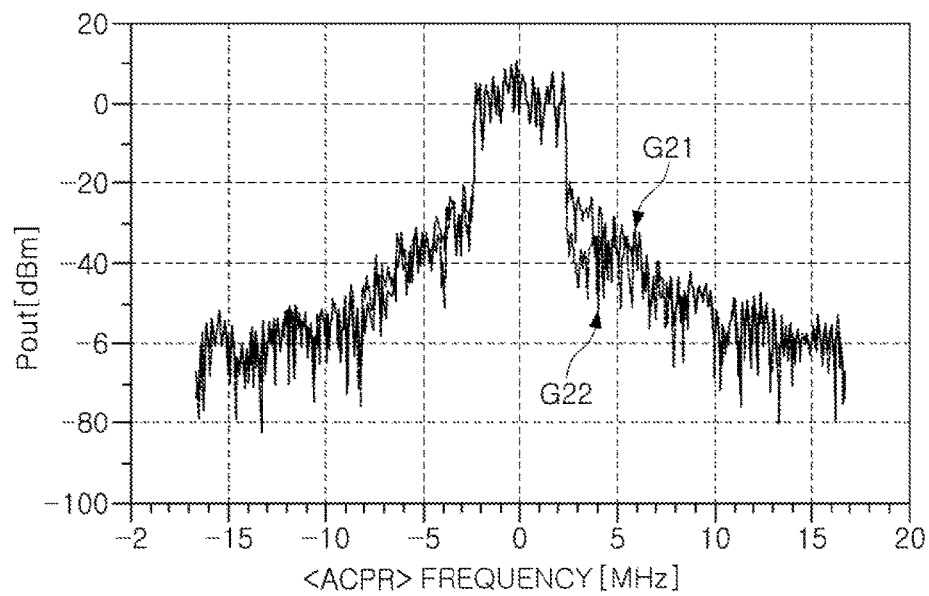
FIG. 20 is a graph illustrating an example of adjacent channel power ratio (ACPR) simulation results.

FIG. 19 is a graph illustrating an example of AM-PM distortion simulation results. FIG. 20 is a graph illustrating an example of ACPR simulation results.

As illustrated in FIG. 19, G11 is a graph illustrating an example of AM-PM distortion produced by a fixed bias current of the related art, and G12 is a graph illustrating an example of AM-PM distortion produced by an ET bias current of this application.

Referring to G11 and G12 of FIG. 19, the AM-PM distortion produced by the ET bias current of this application is reduced by about 5 degrees compared to the AM-PM distortion produced by the fixed bias current of the related art.

As illustrated in FIG. 20, G21 is a graph illustrating an example of an ACPR produced by a fixed bias current of the related art, and G22 is a graph illustrating an example of an ACPR produced by an ET bias current of this application.

Referring to G21 and G22 of FIG. 20, the ACPR produced by the ET bias current of this application is increased by about 7 dB (i.e., from −33.076 dB to −41.772 dB) in an upper channel thereof and about 4 dB (i.e., from −32.849 dB to −36.902 dB) in a lower channel thereof compared to the ACPR produced by the fixed bias current of the related art.

FIGS. 21A, 21B, 21C, 21, 21E, 21F, 21G, 21H, and 21I are graphs illustrating examples of AM-PM distortion simulation results for different ratios of a second bias current Ibias2 to a first bias current Ibias1.

Figure 21A:
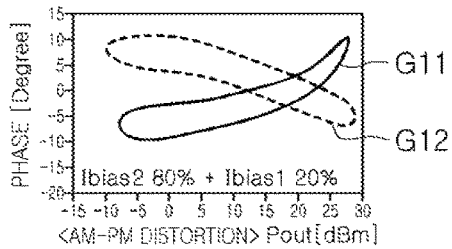
FIGS. 21A, 21B, 21C, 21D, 21E, 21F, 21G, 21H, and 21I are graphs illustrating examples of AM-PM distortion simulation results according to a ratio of a second bias current Ibias2 to a first bias current Ibias1.
Figure 21B:
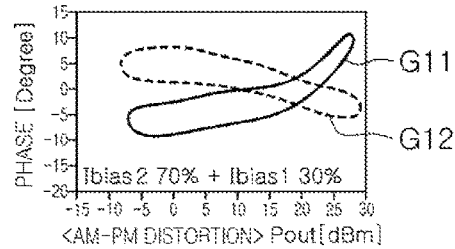
Figure 21C:
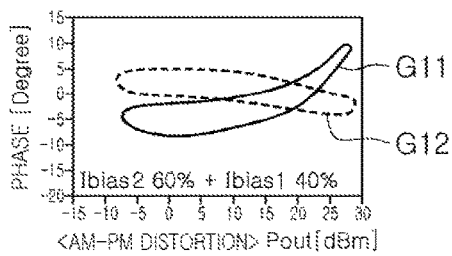
Figure 21D:
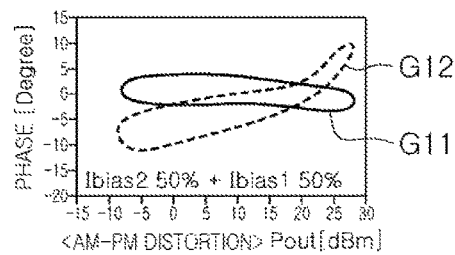
Figure 21E:
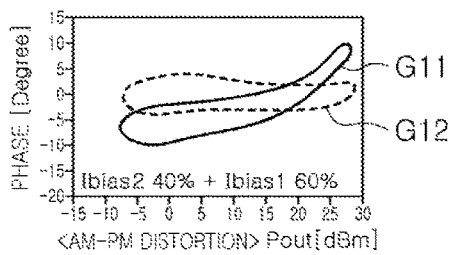
Figure 21F:
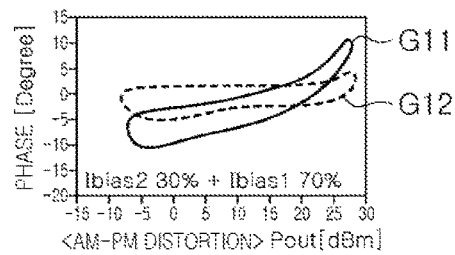
Figure 21G:
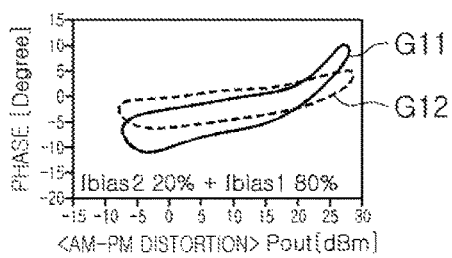
Figure 21H:
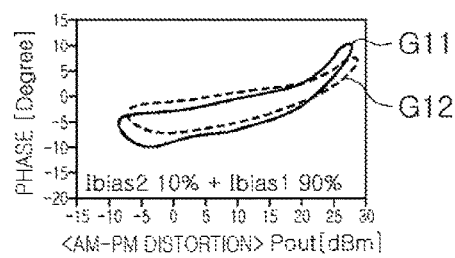
Figure 21I:
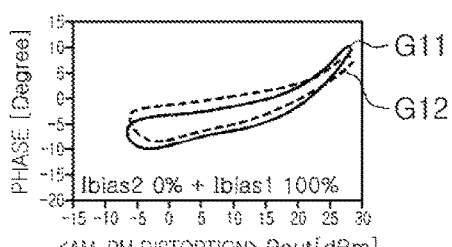

FIG. 21A is a graph illustrating an example of AM-PM distortion for a case in which the ratio of the second bias current Ibias2 to the first bias current Ibias1 is 80% to 20%. FIG. 21B is a graph illustrating an example of AM-PM distortion for a case in which the ratio of the second bias current Ibias2 to the first bias current Ibias1 is 70% to 30%. FIG. 21C is a graph illustrating an example of AM-PM distortion for a case in which the ratio of the second bias current Ibias2 to the first bias current Ibias1 is 60% to 40%. FIG. 21D is a graph illustrating an example of AM-PM distortion for a case in which the ratio of the second bias current Ibias2 to the first bias current Ibias1 is 50% to 50%. FIG. 21E is a graph illustrating an example of AM-PM distortion for a case in which the ratio of the second bias current Ibias2 to the first bias current Ibias1 is 40% to 60%. FIG. 21F is a graph illustrating an example of AM-PM distortion for a case in which the ratio of the second bias current Ibias2 to the first bias current Ibias1 is 30% to 70%. FIG. 21G is a graph illustrating an example of AM-PM distortion for a case in which the ratio of the second bias current Ibias2 to the first bias current Ibias1 is 20% to 80%. FIG. 21H is a graph illustrating an example of AM-PM distortion for a case in which the ratio of the second bias current Ibias2 to the first bias current Ibias1 is 10% to 90%. FIG. 21I is a graph illustrating an example of AM-PM distortion for a case in which the ratio of the second bias current Ibias2 to the first bias current Ibias1 is 0% to 100%, meaning that there is no ET bias in this case since the second bias current Ibias2 at the ratio of 0% is generated based on the envelope voltage Venv and the first bias current Ibias1 at the ratio of 100% is generated based on the reference voltage Vref.

As illustrated in FIGS. 21A through 21I, G11 is a graph illustrating an example of AM-PM distortion for the fixed bias current of the related art, and G12 is a graph illustrating an example of AM-PM distortion for the ET bias current of this application.

Referring to G11 and G12 of FIGS. 21A through 21I, when the ET bias current of this application includes a second bias current Ibias2 generated based on an envelope voltage at a higher ratio than a ratio of a first bias current Ibias1 generated based on a reference voltage, AM-PM distortion is relatively reduced.

In the examples described above, when the power of the input signal RFin is high, the power supply voltage VCC increases, while the base-emitter DC voltage VBE (DC) decreases. To prevent an occurrence of AM-PM distortion, an amount of the decrease in the base-emitter DC voltage VBE (DC) is reduced by increasing the value of the ET bias current. Conversely, when the power of the input signal RFin is low, the power supply voltage VCC decreases, while the base-emitter DC voltage VBE (DC) increases. To prevent an occurrence of AM-PM distortion, an amount of the increase in the base-emitter DC voltage VBE (DC) is reduced by decreasing the value of the ET bias current.

As a result, a variation of the base-emitter DC voltage VBE (DC) depending on a variation of the power supply voltage VCC is significantly reduced, thus reducing AM-PM distortion and improving ACPR.

In the examples described above, the use of an envelope tracking (ET) bias current prevents a variation, such as a decrease, in the base-emitter direct current (DC) voltage of the power amplifier circuit when the power of the input signal is high, and prevents a variation, such as an increase, in the base-emitter DC voltage of the power amplifier circuit when the power of the input signal is low, thereby reducing the variation in the base-emitter DC voltage of the power amplifier circuit despite the variation in the power of the input signal and the change in the power supply voltage VCC, thus reducing AM-PM distortion and improving ACPR.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An envelope tracking current bias circuit of a power amplifier circuit, the power amplifier circuit comprising a power amplifier, the envelope tracking current bias circuit comprising:
   a first current source circuit configured to generate a first bias current based on a fixed reference voltage;
   a second current source circuit configured to receive an envelope voltage of an input signal, and generate a second bias current proportional to the envelope voltage; and
   a bias current generator configured to generate a first envelope tracking bias current based on the first bias current and the second bias current, and supply the first envelope tracking bias current to the power amplifier circuit to reduce amplitude modulation-phase modulation (AM-PM) distortion of the power amplifier circuit;
   wherein the first bias current is independent of the envelope voltage.

2. The envelope tracking current bias circuit of claim 1, wherein the first current source circuit is further configured to adjust a value of the first bias current in response to a first control signal.

3. The envelope tracking current bias circuit of claim 1, wherein the second current source circuit is further configured to adjust a value of the second bias current in response to a second control signal.

4. The envelope tracking current bias circuit of claim 1, wherein the bias current generator is connected between an output node of the first current source circuit and an output node of the second current source circuit, and is further configured to sum the first bias current and the second bias current to generate the first envelope tracking bias current.

5. The envelope tracking circuit bias circuit of claim 1, wherein the first current source circuit comprises:
   a first resistor; and
   a first operational amplifier configured to receive the fixed reference voltage and apply the fixed reference voltage across the first resistor to cause a fixed reference current to flow through the first resistor;
   the first current source circuit is further configured to generate the first bias current based on the fixed reference current;
   the second current source circuit comprises:
   a second resistor; and
   a second operational amplifier configured to receive the envelope voltage and apply the envelope voltage across the resistor to cause an envelope current to flow through the second resistor; and
   the second current source circuit is further configured to generate the second bias current based on the envelope current.

6. A power amplifier apparatus comprising:
   an envelope tracking current bias circuit configured to receive an envelope voltage of an input signal, and generate a first envelope tracking bias current based on a fixed reference voltage and the envelope voltage; and
   a power amplifier circuit configured to be current biased based on the first envelope tracking bias current to amplify power of the input signal;
   wherein the power amplifier circuit comprises:
   a power amplifier configured to receive the input signal at a base of the power amplifier and amplify the power of the input signal; and
   a buffered bias circuit configured to generate a second envelope tracking bias current based on the first envelope tracking bias current, and supply the second envelope tracking bias current to the base of the power amplifier to reduce AM-PM distortion of the power amplifier circuit; and
   the first envelope tracking bias current comprises:
   a first bias current depending on the fixed reference voltage and independent of the envelope voltage; and
   a second bias current proportional to the envelope voltage.

7. The power amplifier apparatus of claim 6, wherein the envelope tracking current bias circuit comprises:
   a first current source circuit configured to generate the first bias current based on the fixed reference voltage so that the first bias current is independent of the envelope voltage;
   a second current source circuit configured to generate the second bias current proportional to the envelope voltage; and a bias current generator configured to generate the first envelope tracking bias current based on the first bias current and the second bias current, and supply the first envelope tracking bias current to the buffered bias circuit.

8. The power amplifier apparatus of claim 7, wherein the first current source circuit is further configured to adjust a value of the first bias current in response to a first control signal.

9. The power amplifier apparatus of claim 7, wherein the second current source circuit is further configured to adjust a value of the second bias current in response to a second control signal.

10. The power amplifier apparatus of claim 7, wherein the bias current generator is connected between an output node of the first current source circuit and an output node of the second current source circuit, and is further configured to sum the first bias current and the second bias current to generate the first envelope tracking bias current.

11. The power amplifier apparatus of claim 7, further comprising an envelope tracking circuit configured to supply the envelope voltage of the input signal as a power supply voltage to the power amplifier circuit;
wherein the envelope tracking current bias circuit is further configured to receive the power supply voltage as the envelope voltage from the envelope tracking circuit.

12. The power amplifier apparatus of claim 7, further comprising an envelope detecting circuit configured to detect the envelope voltage of the input signal;
wherein the envelope tracking current bias circuit is further configured to receive the envelope voltage from the envelope detecting circuit.

13. The power amplifier apparatus of claim 7, wherein the buffered bias circuit comprises:
a current bias circuit connected between an output terminal of the envelope tracking current bias circuit and a ground; and
a current amplifier configured to be current biased by the current bias circuit to amplify the first envelope tracking bias current to generate the second envelope tracking bias current.

14. The power amplifier apparatus of claim 13, wherein the current amplifier comprises a resistor connected to an output terminal of the current amplifier from which the second envelope tracking bias current is output to prevent thermal runaway.

15. A power amplifier comprising:
an envelope tracking current bias circuit configured to generate a first envelope tracking bias current based on an envelope voltage of an input signal; and
a power amplifier circuit configured to be current biased based on the first envelope tracking bias current to amplify power of the input signal;
wherein the power amplifier circuit comprises:
a power amplifier configured to receive the input signal at a base of the power amplifier and amplify the power of the input signal; and
a buffered bias circuit configured to generate a second envelope tracking bias current based on the first envelope tracking bias current, and supply the second envelope tracking bias current to the base of the power amplifier to reduce AM-PM distortion of the power amplifier circuit;
the envelope tracking current bias circuit comprises:
a first current source circuit configured to generate a first bias current based on a reference voltage;
a second current source circuit configured to generate a second bias current based on the envelope voltage; and
a bias current generator configured to generate the first envelope tracking bias current based on the first bias current and the second bias current, and supply the first envelope tracking bias current to the buffered bias circuit;
the buffered bias circuit comprises:
a current bias circuit connected between an output terminal of the envelope tracking current bias circuit and a ground; and
a current amplifier configured to be current biased by the current bias circuit to amplify the first envelope tracking bias current to generate the second envelope tracking bias current; and
the current bias circuit comprises:
a first bias resistor connected between the output terminal of the envelope tracking current bias circuit and a base of the current amplifier; and
a temperature compensating circuit connected between the base of the current amplifier and the ground, and having a temperature-dependent resistance value.

16. The power amplifier apparatus of claim 15, wherein the temperature compensating circuit comprises at least two diode-connected transistors connected in series between the base of the current amplifier and the ground.

17. The power amplifier apparatus of claim 15, wherein the temperature compensating circuit comprises at least two diodes connected in series between the base of the current amplifier and the ground.

18. A power amplifier apparatus comprising:
a power amplifier having a base and configured amplify an input signal applied to the base;
a tracking current bias circuit configured to receive an envelope voltage of an input signal, and generate a first tracking bias current based on a fixed reference value and the envelope voltage of the input signal; and
a buffered bias circuit configured to amplify the first tracking bias current to generate a second tracking bias current, and apply the second tracking bias current to the base of the power amplifier to reduce amplitude modulation-phase modulation (AM-PM) distortion of the power amplifiers;
wherein the first tracking bias current comprises:
a first bias current depending on the fixed reference value and independent of the envelope voltage; and
a second bias current proportional to the envelope voltage.

19. The power amplifier apparatus of claim 18, wherein the tracking current bias circuit comprises:
a first current source circuit configured to generate the first bias current based on the fixed reference value so that the first bias current is independent of the envelope voltage;
a second current source circuit configured to generate the second bias current proportional to the envelope voltage of the input signal; and
a bias current generator configured to sum the first bias current and the second bias current to generate the first tracking bias current.

20. The power amplifier apparatus of claim 19, wherein the tracking current bias circuit is further configured to adjust a ratio of the first bias current to the second bias current in the first tracking bias current.

21. A power amplifier apparatus comprising:
a power amplifier circuit configured to amplify an input signal and having a characteristic that produces amplitude modulation-phase modulation (AM-PM) distortion that varies in response to a voltage level of the input signal; and
an envelope tracking current bias circuit configured to receive an envelope voltage of the input signal, generate a first tracking bias current based on a fixed reference voltage and the envelope voltage, and apply the first tracking bias current to the power amplifier circuit to reduce the AM-PM distortion of the power amplifier circuit;
wherein the first tracking bias current comprises:
a first bias current depending on the fixed reference voltage and independent of the envelope voltage; and
a second bias current proportional to the envelope voltage.

22. The power amplifier apparatus of claim 21, wherein the power amplifier circuit comprises:
a power amplifier having a base to which the input signal is applied, and configured to amplify the input signal applied to the base; and
a buffered bias circuit configured to amplify the first tracking bias current to generate a second tracking bias current, and apply the second tracking bias current to the base of the power amplifier to reduce the amplitude modulation-phase modulation (AM-PM) distortion of the power amplifier circuit.

23. The power amplifier apparatus of claim 22, wherein the power amplifier comprises a bipolar junction transistor (BJT) having the base, a collector, an emitter, a base-emitter direct current (DC) voltage (VBE) that varies in response to the voltage level of the input signal, and a collector-base capacitance (Ccb) that varies in response to the VBE, thereby producing the AM-PM distortion.

24. The power amplifier apparatus of claim 23, further comprising an envelope tracking circuit configured to generate a power supply voltage (VCC) based on the envelope voltage of the input signal, and apply the VCC to the collector of the BJT;
wherein the collector of the BJT is configured to output the amplified input signal; and
the emitter of the BJT is connected to a ground.

* * * * *